(12) United States Patent
Ogura et al.

(10) Patent No.: US 9,136,403 B2
(45) Date of Patent: Sep. 15, 2015

(54) SEMICONDUCTOR DEVICE WITH WIRINGS OF DIFFERING YOUNG'S MODULUS AND METHOD FOR FABRICATING THE SAME

(71) Applicant: CANON KABUSHIKI KAISHA, Tokyo (JP)

(72) Inventors: Masanori Ogura, Tokyo (JP); Hideo Kobayashi, Tokyo (JP); Tetsunobu Kochi, Hiratsuka (JP); Masashi Kitani, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 66 days.

(21) Appl. No.: 13/830,586

(22) Filed: Mar. 14, 2013

(65) Prior Publication Data

US 2013/0285189 A1 Oct. 31, 2013

(30) Foreign Application Priority Data

Apr. 27, 2012 (JP) ................. 2012-103718

(51) Int. Cl.
*H01L 31/02* (2006.01)
*H01L 23/532* (2006.01)
*H01L 27/146* (2006.01)

(52) U.S. Cl.
CPC .... *H01L 31/02002* (2013.01); *H01L 23/53271* (2013.01); *H01L 27/14603* (2013.01); *H01L 27/14636* (2013.01)

(58) Field of Classification Search
CPC .................. H01L 27/3297; H01L 31/02002; H01L 31/02005
See application file for complete search history.

(56) References Cited

U.S. PATENT DOCUMENTS

| | | | |
|---|---|---|---|
| 5,408,052 A * | 4/1995 | Inaba et al. | 174/261 |
| 7,642,653 B2 | 1/2010 | Kuzuhara | |
| 7,944,054 B2 | 5/2011 | Matsunaga | |
| 7,956,473 B2 | 6/2011 | Momono | |
| 2010/0102455 A1 | 4/2010 | Yokoi | |
| 2010/0224942 A1 * | 9/2010 | Lim | 257/384 |
| 2013/0270666 A1 * | 10/2013 | Sato et al. | 257/438 |

FOREIGN PATENT DOCUMENTS

| | | |
|---|---|---|
| CN | 101170091 A | 4/2008 |
| JP | 2000-299764 A | 10/2000 |
| JP | 2008-159974 A | 7/2008 |
| KR | 10-2009-0033007 A | 4/2009 |
| RU | 2441298 C2 | 1/2012 |

* cited by examiner

*Primary Examiner* — Daniel Luke
(74) *Attorney, Agent, or Firm* — Canon U.S.A., Inc. IP Division

(57) ABSTRACT

In a semiconductor device including unit cells which are aligned in one direction, wirings disposed along end portions in the one direction have high Young's moduli.

20 Claims, 4 Drawing Sheets

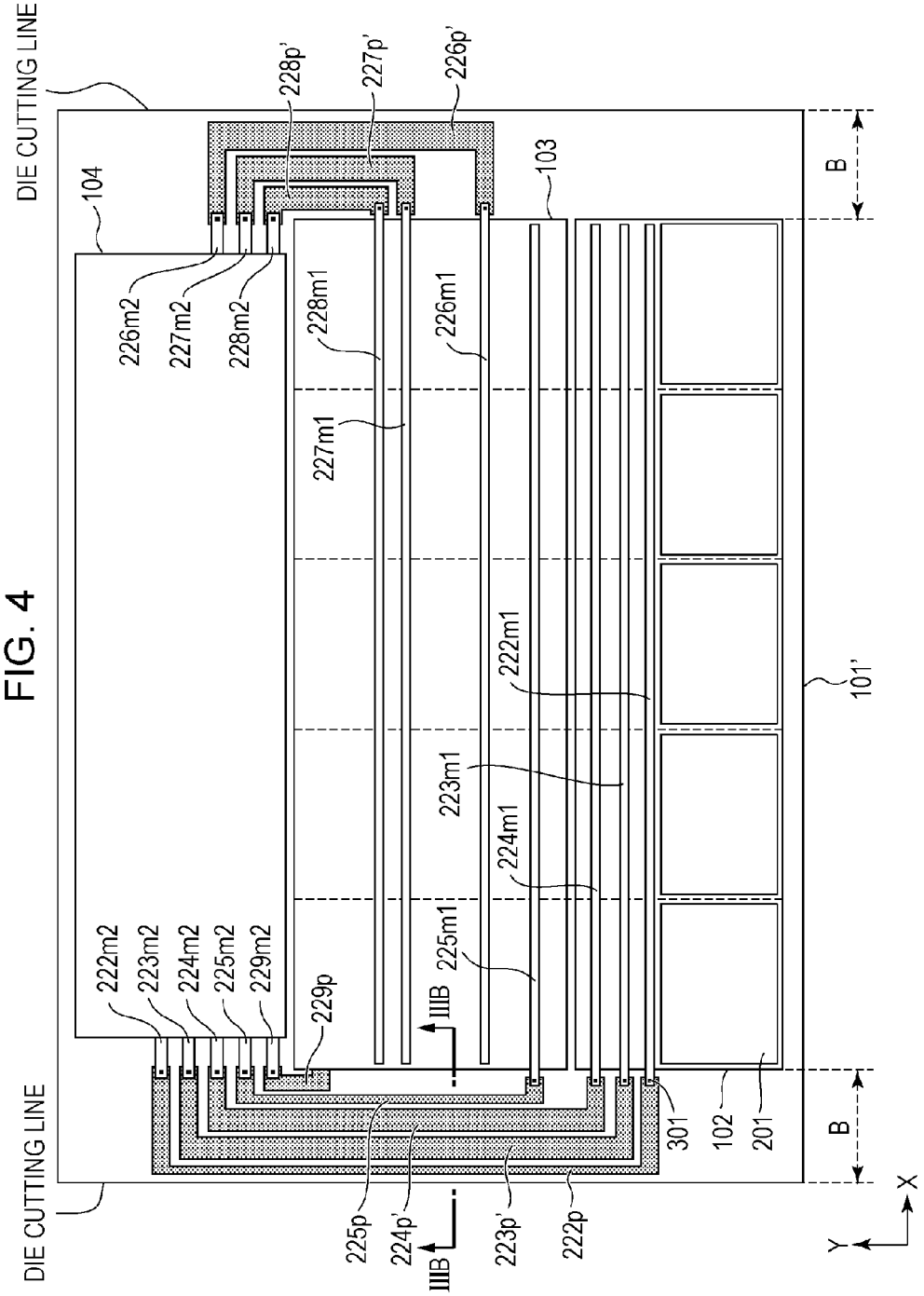

SEMICONDUCTOR DEVICE WITH WIRINGS OF DIFFERING YOUNG'S MODULUS AND METHOD FOR FABRICATING THE SAME

BACKGROUND OF THE INVENTION

1. Technical Field

The present invention relates to a semiconductor device.

2. Description of the Related Art

An apparatus including a plurality of semiconductor devices arranged therein which have equivalent functions which realize a single function is known. Japanese Patent Laid-Open No. 2000-299764 discloses a configuration of an image sensor unit including a plurality of photoelectric conversion devices arranged therein.

SUMMARY

The present disclosure provides a semiconductor device including a plurality of unit cells aligned in one direction and a wiring group. The wiring group includes a first wiring and a second wiring which has a Young's modulus higher than a Young's modulus of the first wiring and which is disposed along an end portion in the one direction of the semiconductor device.

The present disclosure provides a method for fabricating a semiconductor device which includes a plurality of unit cells which are aligned in one direction and a wiring group which includes a first wiring and a second wiring having a Young's modulus higher than a Young's modulus of the first wiring. The method includes forming the plurality of unit cells and a plurality of the wiring groups on a semiconductor substrate, and cutting the semiconductor substrate along the second wiring on at least one side.

Further features of the present disclosure will become apparent from the following description of exemplary embodiments with reference to the attached drawings.

BRIEF DESCRIPTION OF THE DRAWINGS

FIG. 4 is a plan view illustrating a photoelectric conversion device according to a second embodiment.

DESCRIPTION OF THE EMBODIMENTS

In general, when a pitch between adjacent photoelectric conversion devices is larger than a pitch between pixels included in each of the photoelectric conversion devices, resolution at boundaries of the photoelectric conversion devices is degraded. Therefore, in each of the photoelectric conversion devices, a distance between a pixel disposed closest to an end portion and the end portion is preferably reduced.

However, since various wirings are disposed at an end portion of each of the photoelectric conversion devices, when widths of end portions are reduced, the photoelectric conversion devices may be destroyed due to heat and stress generated when dicing the photoelectric conversion devices.

Hereinafter, embodiments are described which reduce occurrences of destroying a semiconductor device due to short-circuit of wiring even when the width of an end portion of the semiconductor device is reduced.

First Embodiment

A first embodiment of the present disclosure will be described with reference to the accompanying drawings. In the following description of this embodiment, a photoelectric conversion device is taken as an example of a semiconductor device.

Figure 1:
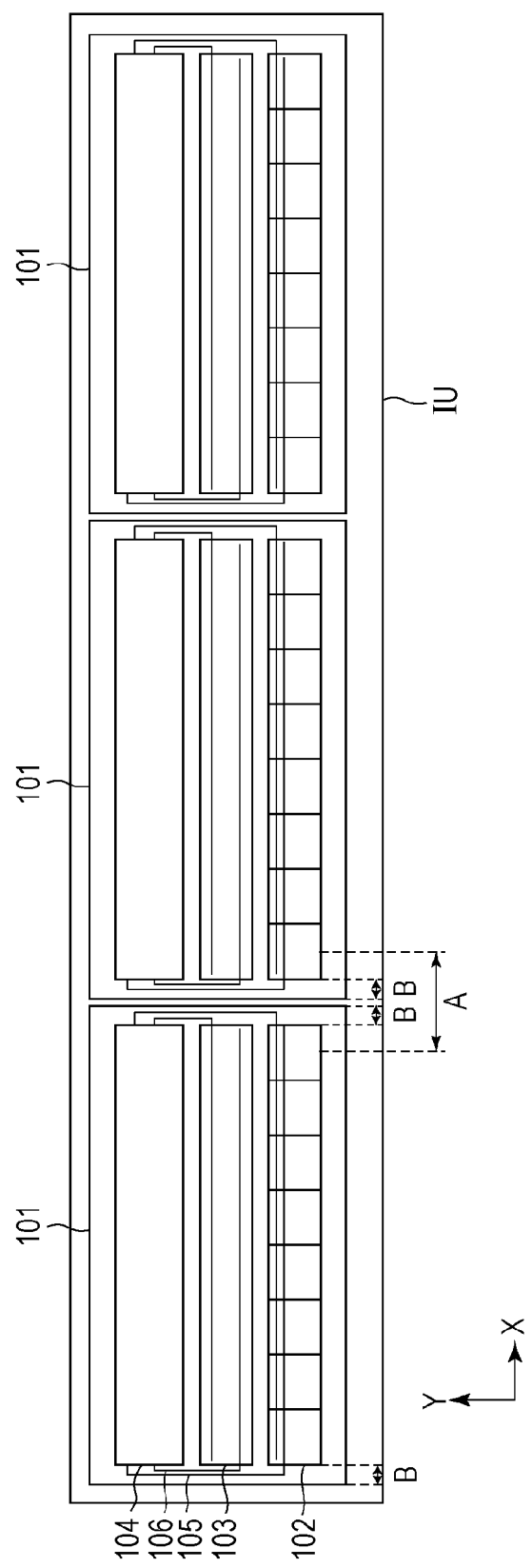
FIG. 1 is a diagram schematically illustrating a configuration of an image sensor unit according to a first embodiment.

FIG. 1 is a diagram schematically illustrating a configuration of an image sensor unit IU including a plurality of photoelectric conversion devices 101 arranged in a line. Image sensor units are used for image reading apparatuses such as facsimiles, flatbed scanners, and photocopiers.

The photoelectric conversion devices 101 are arranged in an X direction, that is, one direction, such that pixels 102 included in the photoelectric conversion devices 101 are arranged in the one direction. Each of the photoelectric conversion devices 101 includes a plurality of pixels 102, a signal processing circuit 103, a peripheral circuit 104, and a wiring group including wirings 105 and 106. The signal processing circuit 103 includes an amplifier, a sample-and-hold circuit, and a scanning circuit, has a function of processing signals supplied from the pixels 102, and has column circuits corresponding to the pixels 102. In other words, assuming that one of the pixels 102 and a corresponding one of column circuits CC constitute a unit cell, unit cells are arranged in a line in the one direction (X direction). The peripheral circuit 104 serving as a signal generation unit generates control signals which control operations of the pixels 102 and the signal processing circuit 103 and generates bias voltages. The control signals and the bias voltages generated by the peripheral circuit 104 are supplied to the pixels 102 and the signal processing circuit 103 through the wirings 105 and 106. Note that, although each of the wirings 105 and 106 are denoted by a single wiring in FIG. 1, each of the wirings 105 and 106 may be a wiring group including a plurality of wirings. Note that, in FIG. 1, wirings between the pixels 102 and the signal processing circuit 103 are omitted.

As a distance A between pixels of adjacent two photoelectric conversion devices 101 becomes larger, resolution is degraded since a region corresponding to the distance A does not include pixels. Therefore, a distance B between a pixel 102 arranged closest to an end portion of each of the photoelectric conversion devices 101 and the end portion is preferably reduced. In this embodiment, assuming that a pitch between unit cells in the one direction is d, the distance B between an end portion of one of the unit cells which is disposed closest to an end portion of a corresponding one of the photoelectric conversion devices 101 in the one direction and the end portion is d/2 or less.

Figure 2:
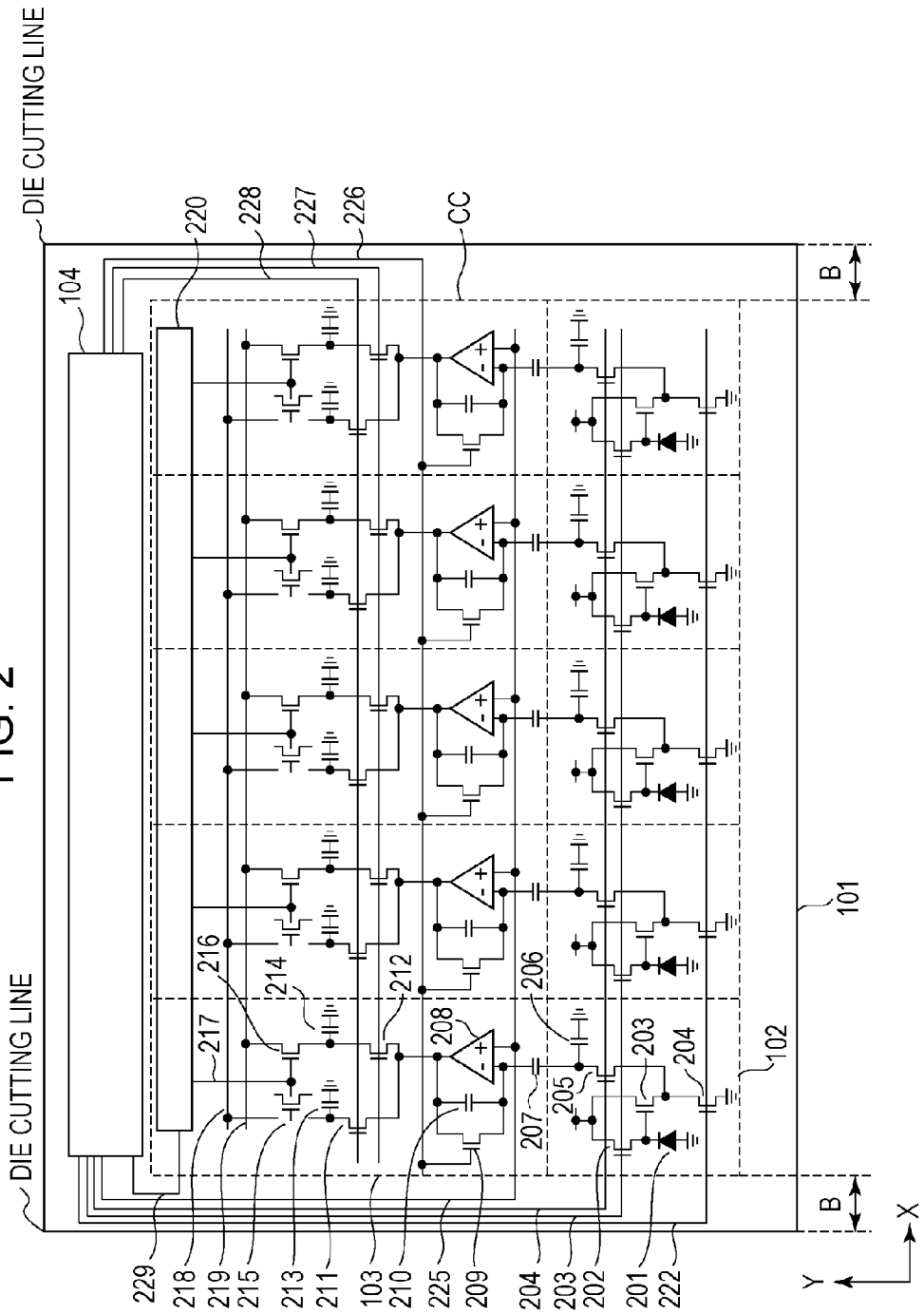
FIG. 2 is a diagram of an equivalent circuit illustrating a configuration of a photoelectric conversion device according to the first embodiment.

FIG. 2 is a diagram illustrating an equivalent circuit of the pixels 102 and the signal processing circuit 103 in detail. Each of the pixels 102 includes a photoelectric conversion element 201, a reset MOS transistor 202, an amplification MOS transistor 203, a load MOS transistor 204, a sample-and-hold MOS transistor 205, and a capacitance 206. A cathode of the photoelectric conversion element 201 is connected to a power source through the reset MOS transistor 202 and connected to a control electrode of the amplification MOS transistor 203. The amplification MOS transistor 203 and the load MOS transistor 204 are arranged in series between the power source and a ground voltage. When the load MOS transistor 204 is turned on, the amplification MOS transistor 203 and the load MOS transistor 204 operate as a source follower circuit. The sample-and-hold MOS transistor 205 and the capacitance 206 function as a signal holding portion which holds signals output from the amplification MOS transistor 203.

In FIG. 2, a configuration of the signal processing circuit 103 including amplifiers and sample-and-hold circuits in individual columns is illustrated. The capacitance 206 is connected to an inverting input terminal of an inverting amplifier 208 through an input capacitance 207. Between the inverting input terminal and an output terminal of the inverting amplifier 208, a MOS transistor 209 and a feedback capacitance 210 are arranged in parallel. A signal stored in the capacitance 206 is amplified by an amplification rate determined by a rate of a capacitance value of the input capacitance 207 to a capacitance value of the feedback capacitance 210. The input capacitance 207, the inverting amplifier 208, and the MOS transistor 209 configure a CDS (Correlated Double Sampling) circuit which reduces noise caused by the pixels 102. The output terminal of the inverting amplifier 208 is connected to a retention volume 213 through a MOS transistor 211, and connected to a retention volume 214 through a MOS transistor 212. The retention volume 213 is connected to a signal line 218 through a MOS transistor 215, and the retention volume 214 is connected to a signal line 219 through a MOS transistor 216. The MOS transistors 215 and 216 are controlled by control signals supplied from a scanning circuit 220 through a line 217. The retention volumes 213 and 214 individually store noise components and signals in which signal components are superposed on the noise components. The noise components may be reduced by obtaining a subtraction value between the noise components and the signals in a circuit in a later stage.

In this embodiment, signals and biases for controlling operations of the individual MOS transistors included in the pixels 102 and the signal processing circuit 103 except for the MOS transistors 215 and 216 controlled by the scanning circuit 220 are supplied from the peripheral circuit 104 through wirings 222 to 229. The wirings 222 to 229 correspond to the wirings 105 and 106 illustrated in FIG. 1.

The photoelectric conversion devices 101 are obtained by cutting out the photoelectric conversion devices 101 formed on a semiconductor wafer along a die cutting line illustrated in FIG. 2. Examples of a dicing method include a method for physically performing cutting using a dicing blade, which is referred to as blade dicing, and a method for cutting a semiconductor substrate by melting the semiconductor substrate by irradiating a laser beam, which is referred to as laser dicing. An insulation member disposed between wirings arranged near the die cutting line may be expand by heat generated due to dicing, and consequently, stress may be generated, and as a result, a crack may be generated.

Furthermore, due to the stress caused by the expanded insulation member, the wirings may be pushed out by the crack. A portion of the wirings which is pushed by the crack is also referred to as "whisker" or "hillock", and this phenomenon is likely to be generated when the wirings are mainly made of aluminum or copper. When the wirings 222 to 229 are pushed by a crack in FIG. 2, the adjacent wirings may short-circuit.

Therefore, each of the photoelectric conversion devices 101 according to this embodiment includes first wirings mainly made of metal and second wirings having effective Young's moduli higher than those of the first wirings, and at least portions of the wirings 222 to 229 are determined as the second wirings. By this, the distance B between an end portion of each of the photoelectric conversion devices 101 which are arranged in a direction in which the unit cells are repeatedly arranged (the X direction) and a corresponding one of the unit cells disposed closest to the end portion may be reduced. This is because the second wirings have relatively high Young's moduli, and therefore, even when the insulation member disposed between the wirings expands due to dicing, the wirings are prevented from being pushed out by a crack. Consequently, the adjacent wirings are prevented from short-circuiting. Specifically, according to this embodiment, the distance B may be reduced while the photoelectric conversion devices 101 are prevented from being destroyed at a time of dicing. In the image sensor unit IU including the photoelectric conversion devices 101 arranged therein, a pitch between the photoelectric conversion devices 101 may be reduced and deterioration of resolution at boundaries between the photoelectric conversion devices 101 may be suppressed.

Note that the effective Young's moduli are determined by materials constituting the wirings. It is assumed that a wiring is constituted by materials A, B, and C and Young's moduli of the materials A, B, and C are a, b, and c, respectively. Furthermore, it is assumed that composition ratios of the materials A, B, and C are x, y, and z [at %], respectively. In this case, an effective Young's modulus Y of this wiring is represented by the following equation.

$$Y[\text{at \%}]=(axx+bxy+cxz)/100 \qquad (1)$$

If the wiring is constituted by members other than the three materials, an effective Young's modulus is similarly obtained. Note that characteristics of the wirings are determined mainly depending on a material which occupies a composition ratio of 70 [at %] or more.

Furthermore, a main material of a wiring corresponds to a material having the highest composition ratio among materials which constitute the wiring. The first wirings include aluminum, copper, titanium, tungsten, and the like, and a typical main material of the first wirings is aluminum, copper, or an alloy of aluminum and copper. A main material of the second wirings having Young's moduli higher than Young's moduli of these materials is polysilicon or silicide polysilicon, for example. When the main material occupies the composition ratio of 70 [at %] or more, the characteristics of the wirings are easily estimated. Accordingly, when Young's moduli of the two types of wiring each of which includes a main material which occupies the composition ratio of 70 [at %] or more are compared with each other, Young's moduli of the main members are compared with each other.

In general, materials having high Young's moduli also have high melting points. When a material which has a high Young's modulus and a high melting point is used as a second wiring, whisker and hillock are further prevented from being generated.

Figure 3A:
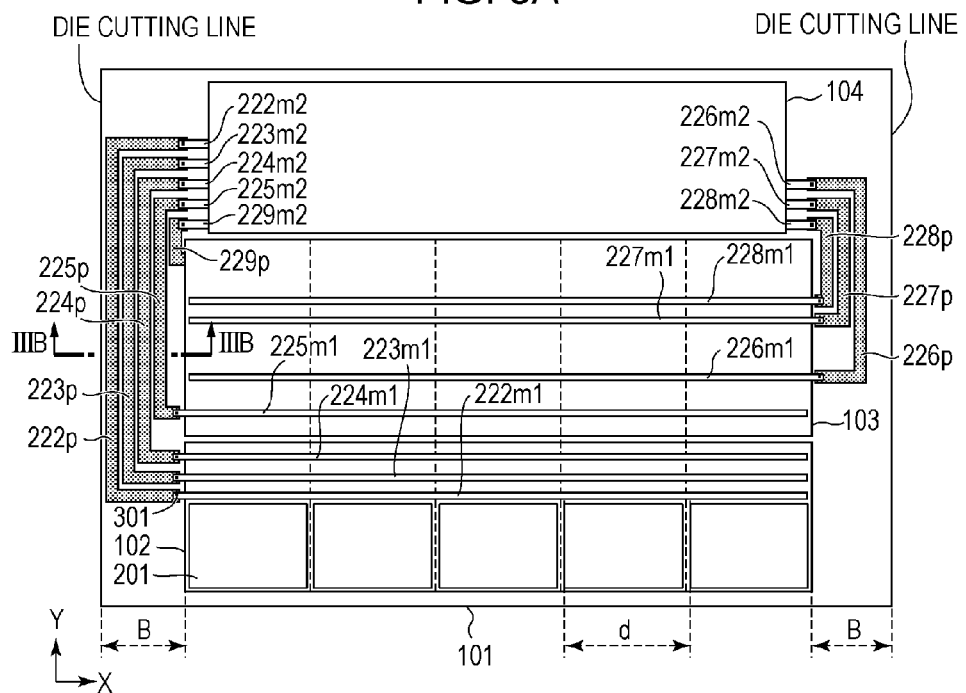
FIGS. 3A and 3B are a plan view and a sectional view, respectively, illustrating the photoelectric conversion device according to the first embodiment.

FIG. 3A is a plan view of one of the photoelectric conversion devices 101. Components which are common to FIGS. 1 and 2 are denoted by the same reference numerals. The wiring 222 illustrated in FIG. 2 includes partial wirings 222*m*1 and 222*m*2 and a partial wiring 222*p*. The partial wiring 222*p* has a region which extends in a Y direction in FIG. 3A, that is, a region which extends along a die cutting line which intersects with the one direction. The partial wirings 222*m*1 and 222*m*2 have regions which extend in the X direction in FIG. 3A, that is, regions which extend along a die cutting line in the one direction. Here, a case where the X direction and the Y direction are orthogonal to each other is illustrated. The partial wiring 222*p* and the partial wirings 222*m*1 and 222*m*2 are connected to each other through plugs 301 denoted by black rectangles.

The partial wiring 222*p* has an effective Young's modulus higher than those of the partial wirings 222*m*1 and 222*m*2. Specifically, this relationship is satisfied when materials constituting the partial wirings 222m1 and 222m2 include aluminum, copper, or an alloy of aluminum and copper of a composition ratio of 70% or more and a material constituting the partial wiring 222p includes polysilicon of a composition ratio of 70% or more. The partial wiring 222p serving as the second wiring is hardly deformed when compared with the partial wirings 222m1 and 222m2 serving as the first wirings. Therefore, with the configuration described above, even when heat or stress is generated when the photoelectric conversion device 101 is subjected to dicing, possibility of generation of hillock and whisker is suppressed.

When main materials of the partial wiring 222m1, partial wirings 223m1 to 228m1, the partial wiring 222m2, and partial wirings 223m2 to 229m2 are metal, since these partial wirings are used to commonly supply signals and biases to the plurality of unit cells, impedance may be reduced. In general, since sides of each of the photoelectric conversion devices 101 which extend along the X direction in which the unit cells are repeatedly arranged are longer than sides which extend in the Y direction intersecting the X direction, main materials of partial wirings which extend in the X direction are preferably made of metal so that low impedance is attained. In particular, in each of the photoelectric conversion devices 101 according to this embodiment, when metal is used as a main material, wirings which extend across the unit cells may be made thin. Accordingly, metal is preferable for a main material to suppress lowering of quantity of light which is incident on the photoelectric conversion element 201. On the other hand, since wirings which extend along the sides in the Y direction are relatively short, even when the main materials are polysilicon having impedance larger than that of metal, delay amounts of signals are suppressed as small as possible. When the main material of the partial wiring 222p is silicide polysilicon, small impedance is obtained when compared with polysilicon.

As with the wiring 222, when each of the wirings 223 to 229 includes a plurality of partial wirings, possibility of generation of hillock and whisker is further lowered. However, at least one of the wirings 222 to 229 preferably includes first and second wirings. In this embodiment, the partial wiring 222p and partial wirings 223p to 229p extend in parallel as regions formed at least at end portions in the X direction along the end portions.

Note that it is not necessarily the case that the entire wirings 222p to 229p are the second wirings, but only portions which are located at end portions in the X direction and which are along the die cutting line may correspond to the second wirings. Specifically, in FIG. 3A, although the wirings 222p to 229p have U-shapes, regions corresponding to straight lines which extend along the die cutting line in the Y direction preferably have effective Young's moduli higher than those of the partial wirings 222m1 to 228m1 and partial wirings 222m2 to 229m2.

Figure 3B:
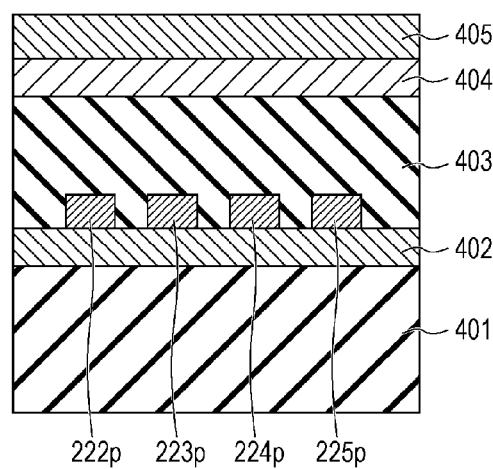

FIG. 3B is a sectional view corresponding to a cross-sectional surface IIIB illustrated in FIG. 3A. A field oxide 402 is disposed on silicon 401, and the partial wirings 222p to 225p are disposed on the field oxide 402. The partial wirings 222p to 225p are electrically insulated by an inter-wiring insulation film 403. A wiring 404 is formed on the inter-wiring insulation film 403, and a protective film 405 is disposed on the wiring 404.

The wiring 404 which is not illustrated in FIG. 3A may be made of metal as a main material. This is because, as is apparent from FIG. 3B, since the wiring 404 is wider than the partial wirings 222p to 225p, even when heat or stress is generated at a time of dicing, effects of the heat or the stress disperse, and accordingly, possibility of generation of whisker and hillock is low.

Hereinabove, the configuration of wirings in two layers, that is, a layer including the wirings 222 to 225 and a layer including the wiring 404, has been described. However, the number of wiring layers is not limited to this, and a single layer may be employed or wirings in three or more layers may be employed. When wirings in a number of layers are employed, if at least one of the layers which is a region having an effective Young's modulus higher than those of first wirings is disposed along the die cutting line in the Y direction, possibility of generation of whisker and hillock may be reduced. In other words, when a plurality of photoelectric conversion devices are disposed on a semiconductor substrate and the photoelectric conversion devices are cut out from the semiconductor substrate along the die cutting line extending along the second wirings on at least one side, possibility of generation of whisker and hillock in the obtained photoelectric conversion devices may be reduced.

Second Embodiment

A second embodiment of the present disclosure will be described with reference to the accompanying drawings. Also in this embodiment, a photoelectric conversion device is taken as an example.

FIG. 4 is a diagram illustrating a photoelectric conversion device 101' according to the second embodiment. Components the same as those of the photoelectric conversion devices 101 according to the first embodiment are denoted by reference numerals the same as those of the first embodiment. Also in this embodiment, wirings 222 to 229 include first wirings and second wirings. The second wirings extending along an end portion in one direction (X direction) have effective Young's moduli higher than those of the first wirings.

The second embodiment is different from the first embodiment in that partial wirings 223p', 224p', 226p', 227p', and 228p' are disposed instead of the partial wirings 223p, 224p, 226p, 227p, and 228p. The partial wirings 223p', 224p', 226p', 227p', and 228p' have cross-sectional areas larger than those of partial wirings 222p, 225p, and 229p.

Among bias potentials and control signals transmitted through the wirings, the bias potentials do not considerably vary during an entire period other than a time immediately after the photoelectric conversion device 101' is powered. On the other hand, the control signals considerably vary, when compared with the bias potentials, so as to control conductivity of MOS transistors, and furthermore, there is a wide range of variation from a power source voltage to a GND voltage in many cases.

Since the control signals vary at high speed, the MOS transistors may operate at high speed. Specifically, an operation speed of the photoelectric conversion device 101' may be improved. Accordingly, wirings which transmit the control signals preferably have low impedance. Therefore, in this embodiment, the cross-sectional areas of the partial wirings 223p', 224p', 226p', 227p', and 228p' which transmit control signals are set larger than those of the partial wirings 222p, 225p, and 229p which supply bias potentials.

In general, when a number of second wirings which transmit signals which at least have large amplitudes or large frequencies have cross-sectional areas which are larger than those of the other second wirings, the photoelectric conversion device 101' may operate at high speed.

The larger the cross-sectional areas of the partial wirings 223p', 224p', 226p', 227p', and 228p' become, the larger parasitic capacitances of the partial wirings 223p', 224p', 226p', 227p', and 228p' become, and consequently, impedance increases. However, the partial wirings 223p', 224p', 226p', 227p', and 228p' extend along short sides of the photoelectric conversion device 101', and therefore, adverse effect of the increase of the impedance caused by the increase of the parasitic capacitances is small. On the other hand, the reduction of the impedance due to enlargement of the cross-sectional areas is considerably effective, and accordingly, the impedance may be reduced in total.

According to the second embodiment, as with the first embodiment, destruction of the photoelectric conversion device 101' at a time of dicing may be suppressed. Furthermore, since a number of the second wirings which transmit control signals have cross-sectional areas which are larger than those of the other second wirings which transmit bias potentials, high-speed operation of the photoelectric conversion device 101' is realized.

Other Embodiments

In the foregoing embodiments, a photoelectric conversion device is taken as an example of a semiconductor device, and an image sensor unit including a plurality of photoelectric conversion devices arranged therein has been described. However, the present technique is not limited to this. For example, each of unit cells may have a discharge port instead of a photoelectric conversion element. When such semiconductor devices are aligned, an ink head of an inkjet printer which is included in recording apparatuses may be configured. In such an ink head, missing of printing at boundary portions may be suppressed when a pitch between adjacent semiconductor devices is reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103718 filed Apr. 27, 2012, which is hereby incorporated by reference herein in its entirety.

What is claimed is:

1. A semiconductor device comprising:
a plurality of unit cells aligned in a first direction and including one unit cell disposed closest to one side of the semiconductor device among the plurality of the unit cells, the one side extending in a second direction which intersects with the first direction;
a first wiring electrically connected to the plurality of the unit cells; and
a second wiring electrically connected to the first wiring and disposed between the one side and the one unit cell,
wherein the second wiring has a Young's modulus higher than a Young's modulus of the first wiring.

2. The semiconductor device according to claim 1,
wherein the unit cells are aligned in the first direction with a pitch of d, and
wherein a distance between the one side and the one unit cell is d/2 or less.

3. The semiconductor device according to claim 1,
wherein a melting point of the second wiring is higher than a melting point of the first wiring.

4. The semiconductor device according to claim 1,
wherein the second wiring is disposed directly on a field oxide.

5. The semiconductor device according to claim 1,
wherein a main material of the first wiring is selected from the group consisting of aluminum, copper, and an alloy of aluminum and copper, and
wherein a main material of the second wiring is polysilicon or silicided polysilicon.

6. A semiconductor device comprising:
a plurality of unit cells aligned in a first direction and including one unit cell disposed closest to one side of the semiconductor device among the plurality of the unit cells, the one side extending in a second direction which intersects with the first direction;
a first wiring; and
a second wiring electrically connected to the first wiring and disposed between the one side and the one unit cell,
wherein the second wiring has a Young's modulus higher than a Young's modulus of the first wiring, and
wherein a cross-sectional area of the second wiring is larger than a cross-sectional area of the first wiring.

7. The semiconductor device according to claim 1,
wherein the second wiring transmits a bias voltage or a control signal used to control operations of the unit cells.

8. A semiconductor device including a plurality of unit cells aligned in one direction and a wiring group, the wiring group comprising:
a first wiring; and
a second wiring having a Young's modulus higher than a Young's modulus of the first wiring and disposed along an end portion in the one direction of the semiconductor device,
wherein each of the unit cells includes a photoelectric conversion element.

9. An image sensor unit including a plurality of the semiconductor devices set forth in claim 1,
wherein each of the unit cells includes a photoelectric conversion element, and
wherein the plurality of semiconductor devices are aligned in the one-first direction.

10. An image reading apparatus device including the image sensor unit set forth in claim 9.

11. The semiconductor device according to claim 1,
wherein the first wiring is included in a first wiring group of a plurality of wirings, each of which is mainly constituted by a first material, and
wherein the second wiring is included in a second wiring group of a plurality of wirings mainly constituted by a second material other than the first material.

12. The semiconductor device according to claim 11,
wherein a cross-sectional area of the second wiring is larger than a cross-sectional area of another wiring of the second wiring group, and
wherein the second wiring transmits a signal having at least one of a larger amplitude and larger frequency than the another wiring.

13. The semiconductor device according to claim 11,
wherein the second wiring is disposed in parallel to another wiring of the second wiring group.

14. The semiconductor device according to claim 1,
wherein the first wiring extends in the first direction, and the second wiring extends in the second direction.

15. The semiconductor device according to claim 1,
wherein another side of the semiconductor device is longer than the one side, the another side extending in the first direction.

16. The semiconductor device according to claim 14,
wherein the first wiring is disposed in a layer different from a layer in which the second wiring is disposed, and the first wiring and the second wiring are connected to each other through a plug.

17. An apparatus including a plurality of the semiconductor devices set forth in claim 1,
wherein the unit cells includes a discharge port for discharging liquid droplets, and
wherein the plurality of semiconductor devices are aligned in the first direction.

18. The semiconductor device according to claim 1,
wherein a distance from the one side to the second wiring is smaller than a distance from the one side to the one unit cell.

19. The semiconductor device according to claim 1,
wherein a distance from the one side to the second wiring is smaller than a distance from the one side to the first wiring.

20. A method for fabricating the semiconductor device according to claim 1, the method comprising:
forming the first and second wirings on a semiconductor substrate; and
cutting the semiconductor substrate by laser dicing.

* * * * *